United States Patent [19]
Andrä

[11] Patent Number: 5,849,093
[45] Date of Patent: Dec. 15, 1998

[54] PROCESS FOR SURFACE TREATMENT WITH IONS

[76] Inventor: Jürgen Andrä, Hammer Strasse 41b, d-48153, Muenster, Germany

[21] Appl. No.: 256,436

[22] PCT Filed: Dec. 31, 1992

[86] PCT No.: PCT/EP92/03015

§ 371 Date: Sep. 12, 1994

§ 102(e) Date: Sep. 12, 1994

[87] PCT Pub. No.: WO93/14250

PCT Pub. Date: Jul. 22, 1993

[30] Foreign Application Priority Data

Jan. 8, 1992 [DE] Germany .......................... 42 00 235.4

[51] Int. Cl.$^6$ ...................................................... B08B 7/00
[52] U.S. Cl. ................................ 134/1.3; 134/1; 134/1.1; 134/1.2; 156/345; 204/298.16
[58] Field of Search .................................. 134/1, 1.1, 1.2, 134/1.3; 156/345; 315/111.31; 204/298.16

[56] References Cited

U.S. PATENT DOCUMENTS

| | | | |
|---|---|---|---|
| 4,417,178 | 11/1983 | Geller et al. | 315/111.81 |
| 4,450,031 | 5/1984 | Ono et al. | 156/345 |
| 4,541,890 | 9/1985 | Cuomo et al. | 156/345 |
| 4,631,438 | 12/1986 | Jacquot | 315/111.81 |
| 4,638,216 | 1/1987 | Delaunay et al. | 315/111.81 |
| 4,735,877 | 4/1988 | Kato et al. | 430/5 |
| 4,874,497 | 10/1989 | Matsuoka et al. | 204/298.16 |
| 5,022,977 | 6/1991 | Matsuoka et al. | 204/298.16 |
| 5,110,483 | 5/1992 | Ohmi et al. | 210/787 |

OTHER PUBLICATIONS

Ohmi et al., Low Temperature Silicon Epitaxy by Low–Energy Bias Sputtering, Appl. Phys. Lett., 53(1), 364–366, Aug. 1988.

Delauney et al., Auger Electron Emission from Slow Multicharged Ions Near a Metal Surface, Europhys. Lett., 4(3), 377–382, 1987.

Ohmi et al. Room–Temperature Copper Metallization for Ultralarge–Scale Integrated Circuits by a Low Kinetic–Energy Particle Process Appl. Phys. Let., 52(26), 2236–2238, 1988.

Kaufman, Technology and Applications of Broad–Beam Ion Sources Used in Sputtering., J. Vac. Sci. Technol., 21(3), 725–756, 1982.

Ohmi et al. Formation of Copper Thin Films by a Low Kinetic Energy Particle Process, J. Electrochem. Soc., 138(4), 1089–1097, 1991.

Cheney et al. Sputtering at Acute Incidence, J. of App. Phys. 36(11), 3542–3544, 1965.

Gnaser et al., Angle Integrated Yields of Neutral Clusters in Low–Energy Sputtering of Nickel and Copper, Surface Science, 251/252, 696–700, 1991.

Ohmi et al. In situ Substrate–Surface Cleaning for Very low Teperature Silicon Epitaxy by Low–Kinetic–Energy Particle Bombardment., Appl. Phys. Lett., 53(1), 45–47, 1988.

Varga, Neutralization of Multiply Charged Ions at a Surface, Appl. Phys., A44, 31–41, 1987.

*Primary Examiner*—Jill Warden
*Assistant Examiner*—Alexander Markoff
*Attorney, Agent, or Firm*—Milde, Hoffberg & Macklin, LLP

[57] ABSTRACT

The invention relates to a process for cleaning and smoothing the surface of materials with a monocrystalline, polycrystalline or amorphous structure comprising the steps of: (a) polishing the surface to the lowest mechanically attainable roughness; (c) bombarding the surface with ions of a defined charge and kinetic energy to remove any impurities on the surface. To improve efficiency and especially to reduce the cleaning cycles it is proposed to bombard the surface with at least double-charged ions of low kinetic energy, where the potential energy of the ions causes an interaction with the bonded impurities in accordance with their high charge which removes said impurities. Furthermore the kinetic energy imparted to the ions is determined solely so that the ions can approach the atoms of the surface impurities as closely as possible without, however, penetrating the surface.

16 Claims, 5 Drawing Sheets

PROCESS FOR SURFACE TREATMENT WITH IONS

This application is a 371 application of PCT/EP92/03015.

BACKGROUND OF THE INVENTION

The invention relates to a process for cleaning and smoothing the surface of materials having a monocrystalline, polycrystalline or amorphous structure, wherein the surface is polished to the lowest mechanically attainable roughness, and thereafter the surface is bombarded with ions of a defined charge and kinetic energy to remove any impurities thereon.

A standard process of the kind defined above, with variants, for the cleaning and smoothing of surfaces on the level of atomic dimensions is known and is widely applied. This process is based on a publication by H. E. Farnsworth, R. E. Schlier, T. H. George and R. M. Burger in "Journal of Applied Phasics", 1958, volume 29, pages 1150 to 1161. Examples of materials that can be treated are, for instance, silicon monocrystals for the production of integrated circuits; other semiconductors for the production of optoelectronic components; metallic or semiconducting monocrystals for the development of so called nano-structures; monocrystals as substrate for X-ray mirrors made of multilayers; and polycrystalline, or amorphous metallic, semiconducting, or insulating surfaces which have to be atomically clean and smooth for various production processes.

For the known process, the surface of the material is mechanically polished to the smallest possible roughness and then heated in an ultra high vacuum (UHV) up to a temperature near but clearly below the melting point in order to expel from the interior and to evaporate from the surface all easily volatile impurities. After this treatment, the surface is exposed to an ion bombardment with energies between 200 eV and 10000 eV, preferably 5000 eV, and a high flux density between 10 $\mu A/cm^2$ and 1000 $\mu A/cm^2$ by which binary collisions and collision cascades remove the surface and thereby also the impurities by sputtering. Rare gas ions may be used as the ions, preferably $Ar^+$ singly charged argon ion (see "Sputtering by Particle Bombardment I", ed. R. Behrisch, volume 47 of "Topics in Applied Physics", Springer, N.Y. 1981 and "Sputtering by Particle Bombardment II", ed. J. Roth, volume 52 of "Topics in Applied Physics", Springer, N.Y. 1983).

The treatment with the known process damages the surface, and the ions used, mostly rare gas ions, penetrate into the sample material so that a follow-up treatment of the sample by various cycles of sputtering and annealing is required, which removes the surface damage and outgases the penetrated rare gas atoms so that clean and, in the case of low index monocrystalline surfaces, flat surfaces can also be obtained. The follow-up treatment by annealing (heating) leads to a polycrystalline material by the formation of microcrystals on a particularly rough surface on an atomic scale and runs the risk of recrystallization of initially amorphous surfaces.

Here the term "clean" is defined with respect to the methods of detection, most of which reach a limit of sensitivity of one impurity atom per 1000 proper surface atoms of the material of interest. During sputtering, the transformation of the kinetic energy of the ions in collisions also creates recoil atoms of the impurities which can penetrate into the sample material. A single cycle thus reduces the impurities on the surface, a fraction of which is, however, injected into the sample material and which reappears at the surface during further erosion. As a result, the number of cycles has to be increased and the surface has to be more deeply eroded when a cleaner surface is required.

It is known to lower the energy of the ions in order to reduce the number of sputtering and heating cycles. On the one hand, this measure reduces the penetration depth of the ions into the material and the implantation of impurities by recoil, but on the other hand, the rate of sputtering and therefore the cleaning efficiency is reduced. (H. Gnaser and H. Oechsner, Surface Science 251–252, 1991, pages 696–700). The reduction of the ion energy has therefore to be compensated by an increase of the ion flux with great technical effort in order not to increase the duration of the cleaning cycles.

It is also known to use sputtering ions that approach the surface at grazing angles (typically 10°) with respect to the surface plane. This variant takes advantage of the observation that the rate of sputtering has a maximum between 5° and 10°, that the fraction of penetrating sputtering ions is reduced due to the reduced vertical velocity $v_v = v \cdot \sin(10°)$, and that the fraction of recoil-induced penetrating impurity atoms is also reduced (see K. B. Cheney and E. T. Pitkin, J. Appl. Phys. 36, 1965, pages 3542–3544; I. N. Evdokimov and V. A. Molchanov, Can. J. Phys. 46, 1968, pages 779–782). When employing this process, various sputtering and annealing cycles are still required in order to obtain clean and, in the case of monocrystalline samples, also flat surfaces.

The necessity of various long lasting sputtering and annealing cycles for obtaining clean surfaces is not only time-consuming and cost-intensive, but cuts down the productivity.

One is thus faced with the problem of improving the aforementioned processes in order to significantly reduce the number of sputtering and annealing cycles, preferably to a single sputtering and annealing cycle. The time consumption for cleaning and smoothing of surfaces on an atomic scale could thereby be reduced and the productivity could thereby be considerably improved.

SUMMARY OF THE INVENTION

The invention solves this problem by bombarding the surface of the material to be cleaned according to one of the processes mentioned, at the beginning with at least doubly charged ions of low kinetic energy, where the potential energy of the ions, corresponding to their high charge, gives rise to an interaction with the impurities initially bonded to the surface, which interaction removes them, while the kinetic energy imparted to the ions is determined solely so that the ions can approach the atoms of the surface impurities as closely as possible without, however, penetrating the surface.

In according with the invention, the cleaning and smoothing is caused by the interaction of highly charged ions of low kinetic energy with the surface, where contrary to the use of the relatively high kinetic energy for the sputtering in the previous standard cleaning process, the potential energy, stored in the highly charged ion, is used for the cleaning and smoothing while the relatively low kinetic energy of the highly charged ions is solely necessary so that the ions approach close enough to the impurity atoms at the surface to be effective.

The electronic interaction of highly charged ions with the surface of the material has an influence on the electronic state of the ion by electron exchange between the surface and the ion and on the trajectory of the ion by the attractive force of the image charge, which, for the case of electrically conducting surfaces, is equal to the effective charge of the ion in front of the surface. The electron exchange from the material's surface towards the highly charged, incoming ion sets in, in terms of atomic units of length $a_0=0.0529$ nm, at great distances $z_c$ in front of the first atomic layer of the surface, which is assumed to be located at $z=0$.

It is of significance for the invention that the highly charged ion, on its further path from $z_c$ to a distance $z=d$ in front of the first atomic layer, resonantly captures electrons from the surface into highly excited states and so becomes neutralized—where d is the average lattice distance between atoms in the surface plane. Since these electrons stem from the conduction or valence band, respectively, the resonance energy is determined by the binding energy of these bands. By this "aspiration" of electrons from the surface, local bondings of weakly bound (physisorbed) impurity atoms or molecules are reduced enough, so that they may desorb. Because of that, the surface is cleaned from physisorbed impurity atoms or molecules before the incoming, initially highly charged ion arrives in the close vicinity ($z<d$) of the surface atoms. It can be assumed that the ion dives, in the range of $0<z<d$, into the electron density of the surface which decays exponentially into the vacuum, so that the electronic screening of the surface atoms as well as of the ion core become reduced. This results in a repulsive Coulomb force between the ion core and all nearby surface atoms. For $Ar^+$ ions at a distance of 1.0 $a_0$ in front of the surface atoms, this repulsive potential reaches values on the order of 20 eV (for Mg) up to 116 eV (for Pb), that is on average about 65±55 eV for all surface elements from the lowest to the highest atomic number and correspondingly higher values for higher charged Ar ions with effective charge >1. Depending on its effective charge $q_{eff}$ in this spatial region in front of the surface an initially highly charged ion will be totally reflected if its initial kinetic energy amounts to $$E_0 \leq (65 \pm 55) \cdot q \text{ eV}.$$

Since $q_{eff}$ is unknown, the lowest possible kinetic energies of the highly charged ions is required in order to guarantee a total reflection of the ions at the surface. To obtain total reflection at the collective surface potential, the lowest possible kinetic energy is essential for the invention, since practically no surface atom can be expelled from the material's surface by transfer of kinetic energy in a collision between the ion and a single surface atom. The reduction of the rate of sputtering when lowering the kinetic energy of singly charged ions has definitely been demonstrated (H. Gnaser and H. Oechsner, Surface Science 251/252, 1991, pages 696–700).

The highly charged ions are generated in electronically hot ion source plasma, i.e. plasma with an average charge $(q_m)>1$. By "average" charge is meant the charge of all the non-electronic constituents of the plasma.

At electrically conducting surfaces, one has to subtract another energy $E_B$ from the defined limit of energy $E_0$ which results from the acceleration of the ions by the image charge. It is composed of two terms which geometrically correspond to the regions $z>z_c$ and $z_c>z>d$, respectively. In the first region, one has to use the initial charge q of the ion, yielding a gain of energy $E_{B1}=27.2 \cdot q/z_c$ eV up to the distance $z_c$ from the surface. In the second region, the effective charge of the ion is unknown, so that only a rough estimate is possible. Under the assumption of limited screening by highly excited electrons in the essentially neutralized atom, one may adopt $q_{eff} \approx q/2$ and so obtains $E_{B2} \approx 27.2 \cdot (q/2) \cdot (d^{-1}-z_c^{-1})$ eV. As limiting energy for total reflection, one thus obtains on average $E_0 \leq (65 \pm 55) \cdot (q/2) - E_{B1} - E_{B2}$, which corresponds to approximately $E_0 \approx (30 \pm 25) \cdot q$ eV. Depending on the surface material, one therefore has to choose the limiting initial energy of the highly charged ions between 5·q and 55·q eV in order to guarantee the total reflection of the ions at the surface and thus a negligible sputtering by the ions, that is a treatment of the surface with little damage.

Depending on the surface material and on the choice of $E_0$, distances of closest approach $z_0$ between surface atoms and the ion during the total reflection are expected to range from 0.5 to 2.0 $a_0$. These are distances at which the initially highly charged ions, which are neutralized on their path from $z_c$ to $z_0$, with the captured electrons in external shells, can capture electrons directly from filled inner shells of the surface atoms into their own, still partially empty inner shells. Quasi-resonant electron exchange processes or interatomic Auger neutralization processes are responsible for this electron capture, which takes place with a probability close to 1 for each particular ion at the turning point of its trajectory when it comes close enough to a surface atom. This latter condition is as important for the process of the invention as the condition of total reflection. The low energy of the incoming ions has therefore to be adapted so that the ions can come close enough to the surface atoms, where "close" is defined by the diameter of the orbits of the inner shell electrons to be captured. The resulting optimized ion energies will thus depend on the ion species, on the material to be cleaned, and on the impurities to be removed, so that theoretical estimates as well as experimental determinations will be required from case to case to define the optimum energy for cleaning and smoothing in the range between 5·q and 55·q eV. As soon as the condition of closest approach for capture from inner shells is fulfilled, the number of electrons captured from inner shells of surface atoms per ion may vary statistically around an average of about 0.4·q.

It is essential for the invention that every low energy, initially highly charged ion, extracts at the turning point of its trajectory at the surface at least one, if not several inner shell electrons out of an impurity atom or molecule at this location so that this impurity atom or molecule desorbs with great probability. Quantitatively only little is known about this probability. For incoming ions with $q \geq 5$ it can be assumed to be close to 1 since the presence of one or several inner shell holes in an impurity atom produces Coulomb repulsion of the impurity atom out of the atomic composition at the surface (see M. L. Knotek and P. J. Feibelman, Surf. Sci. 90, 1979, pages 78–90). This Coulomb repulsion can be prevented only by a very rapid ($3 \cdot 10^{-16}$ s) increase of the local density of bonding electrons, coming from the substrate. Since it occurs retarded, the Coulomb repulsion exists during a limited time and creates at least a strong local thermal excitation if the desorption is inhibited. The desorption becomes more probable, the more inner shell holes are created. Since it follows from investigations that an average production of 0.4·q inner shell holes are created per impact by an initially q times charged ion, the probability of desorption per surface atom hit may approach 1 if q is chosen great enough (q>5 for instance).

Since the deexcitation of an inner shell hole of an impurity atom proceeds via an Auger process, during which two valence, i.e., bonding electrons are lost, on the average 0.4·q further attempts of Coulomb repulsion are initiated for atoms which are not yet desorbed by the inner shell holes. They may again be inhibited by the replacement of these two electrons from the substrate in a shorter time than is required for the liberation of the atom from the substrate by Coulomb repulsion. Since the supply of bonding electrons will depend on the material of the substrate (metal, semiconductor, or insulator) and on the type of bonding of the impurity atoms to the substrate material, the probability of desorption per surface atom hit will depend on the material to be cleaned and on the impurities. Impurity atoms metallically bonded to a metal surface will therefore be desorbed with a probability smaller than 1, while weakly bound impurity atoms on semiconductor insulator surfaces will be desorbed with a probability near 1.

When assuming a probability of desorption of 1, one can clean a surface of 1 $cm^2$ of a monolayer of impurities within 20 s with $Ar^{8+}$ ion beams, which can technically be generated nowadays.

The described competition between Coulomb desorption and the supply of bonding electrons leaves, even on an already cleaned metal surface, a probability different from zero for the desorption of surface atoms of the metal. In contrast to the known standard process, only atoms in the first or at best in the second atomic layer are concerned by this desorption when using slow, highly charged ions, so that the crystal structure below the second layer is not damaged. This is a decisive advantage of the process of the invention with respect to the known standard process.

The competition between Coulomb desorption and supply of bonding electrons has as further result that atoms hit by an ion, which do not desorb, are at least thermally excited since the supply of the bonding electrons is retarded with respect to the onset of the Coulomb explosion. On a surface already cleaned, this results in an increased surface mobility of atoms hit by ions, so that they can move towards surface defects (holes) and thereby contribute to a smoothing of the surface. Contributions to smoothing can also be derived from the knowledge that atoms at points or at positions within a convex part of a not yet flat surface are less bound and thus desorb with a greater probability after inner shell ionization than atoms embedded in an ideal surface plane or in a concave part of a surface. A thermal annealing of a plane surface which has been cleaned with slow, highly charged ions is therefore necessary only on a very small scale or often not necessary at all. This is a further important advantage of the claimed process compared to the known standard process.

The process of the invention can be employed during the first thermal outgas and evaporation treatment since the slow, highly charged ions are reflected from the surface and therefore represent a completely negligible additional thermal load. This is a further significant improvement of the productivity of the process of the invention since the long time for the outgasing of the sample can be used simultaneously for the cleaning. Because of that one obtains, immediately after cooling down of the sample, a clean and, in the case of monocrystalline material, even a flat surface for further processing because the insignificant damage of the topmost atomic layers of the surface is healed during the slow cooling down from the phase of outgasing.

In summary one can conclude that the listed advantages of the invention are mainly founded on the fact, that the cleaning and smoothing of surfaces with little damage occurs essentially due to the potential energy stored in the highly charged ion in contrast to the use of the kinetic energy in the prior art standard process. The invention will significantly reduce the cleaning times and will therefore decisively improve the productivity in all production processes where clean surfaces on the level of atomic dimensions are required nowadays, and will therefore largely compensate the higher investments necessary for the process of the invention. Furthermore, the process of the invention can result in reductions of costs in all production processes, where the cleaning of the surfaces was not considered for reasons of costs. Surface cleaning in accordance with the invention may now be included in these production processes, thereby improving the quality of the product and reducing the rejects of production.

A further explanation of the invention follows with examples and a design with reference to the following Figures.

DESCRIPTION OF THE PREFERRED EMBODIMENTS

EXAMPLE 1

Figure 1:
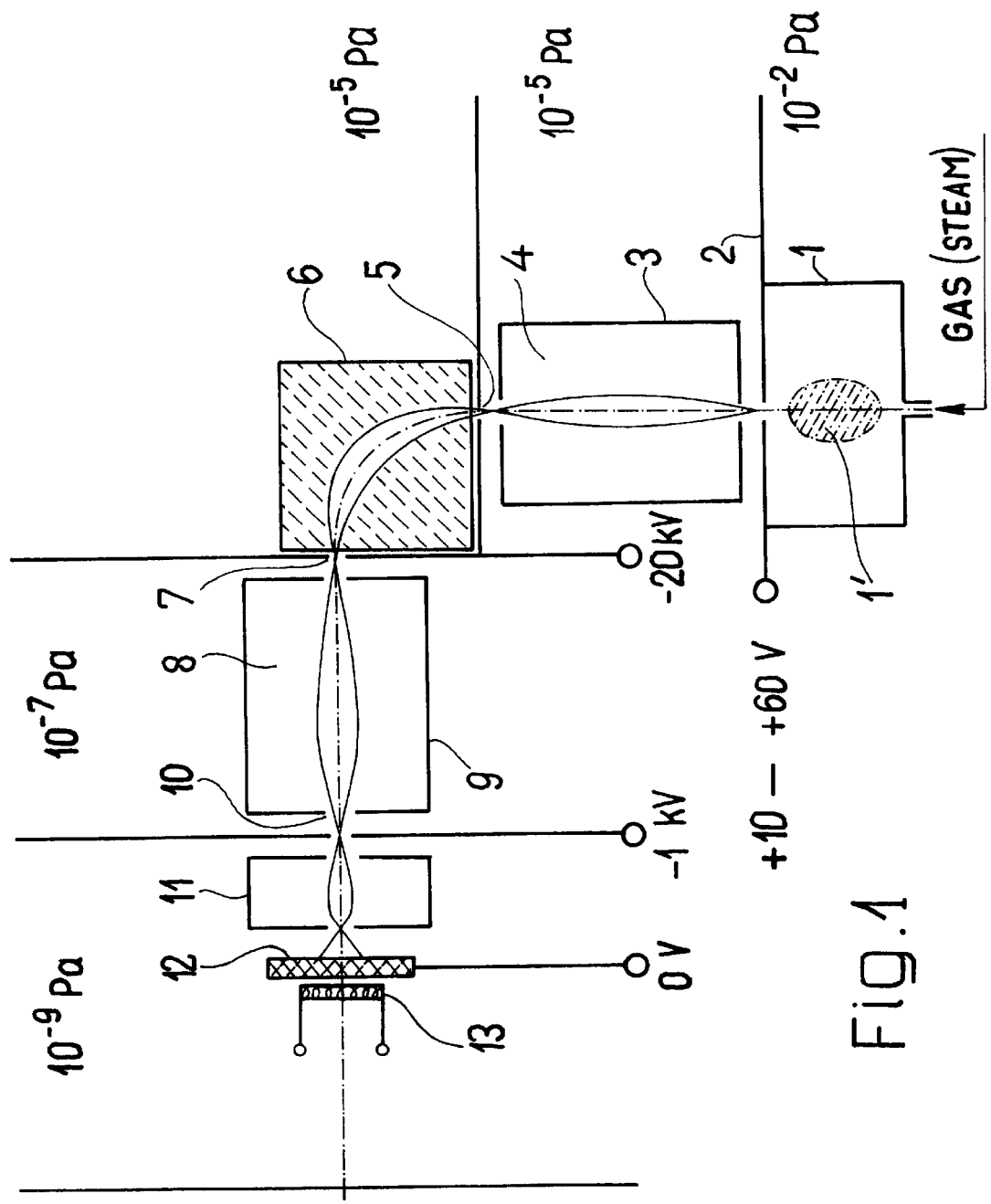
FIG. 1 is a schematic of a first arrangement with which a cleaning and smoothing of a surface can be performed.

(see FIG. 1)

FIG. 1 shows a schematic presentation of an arrangement of a device to carry out the process, as it can be set up with current technology. By means of an extraction electrode 2 and an electrostatic extraction lens 3, both on a potential of −20 kV ions with a mixture of charge states are extracted from an ion source 1 with a plasma 1' and at a potential U between 0 and +60 V, in which at a pressure of $10^{-2}$ Pa rare gas ions (preferably argon ions) are produced with an average charge of $q_m=5$, and are accelerated to $(20000+U) \cdot q$ eV into a zone of pressure 4 of $10^{-5}$ Pa. The extraction lens 3 focuses these ions through an aperture 5 into a double focussing sector magnet 6 or into another ion-optical element for q/m separation, so that ions of a single charge state, e.g., $Ar^{6+}$ or $Ne^{5+}$, are focussed through the aperture 7. The sector magnet 6 also eliminates all electrons present in the ion beam, which can leave the plasma against the extraction voltage and are thus superimposed on the ion beam due to their partially high energy in the plasma 1' of the ion source 1. The exit aperture 7 acts simultaneously as a differential pumping diaphragm, so that the ions enter into a zone of pressure 8 of $10^{-7}$ Pa and will there be decelerated by a first deceleration lens 9 from $(20000+U) \cdot q$ eV to $(1000+U) \cdot q$ eV and then focussed through a second differential pumping diaphragm 10. This allows the construction of a second deceleration lens 11 and of the exposure of a surface to be cleaned 12 in ultra high vacuum of $10^{-9}$ Pa. In the deceleration lens 11, the ions, selected with respect to q/m, are decelerated from $(1000+U) \cdot q$ eV to $U \cdot q$ eV and strike with low energy the surface 12, which in the present case may be a silicon monocrystal (wafer) for the production of electronic chips. A heating 13 of known technical standard is to be provided for the thermal treatment of the surface. Depending on the application, other vacuum conditions and other acceleration and deceleration conditions can be employed.

EXAMPLE 2

Figure 2:
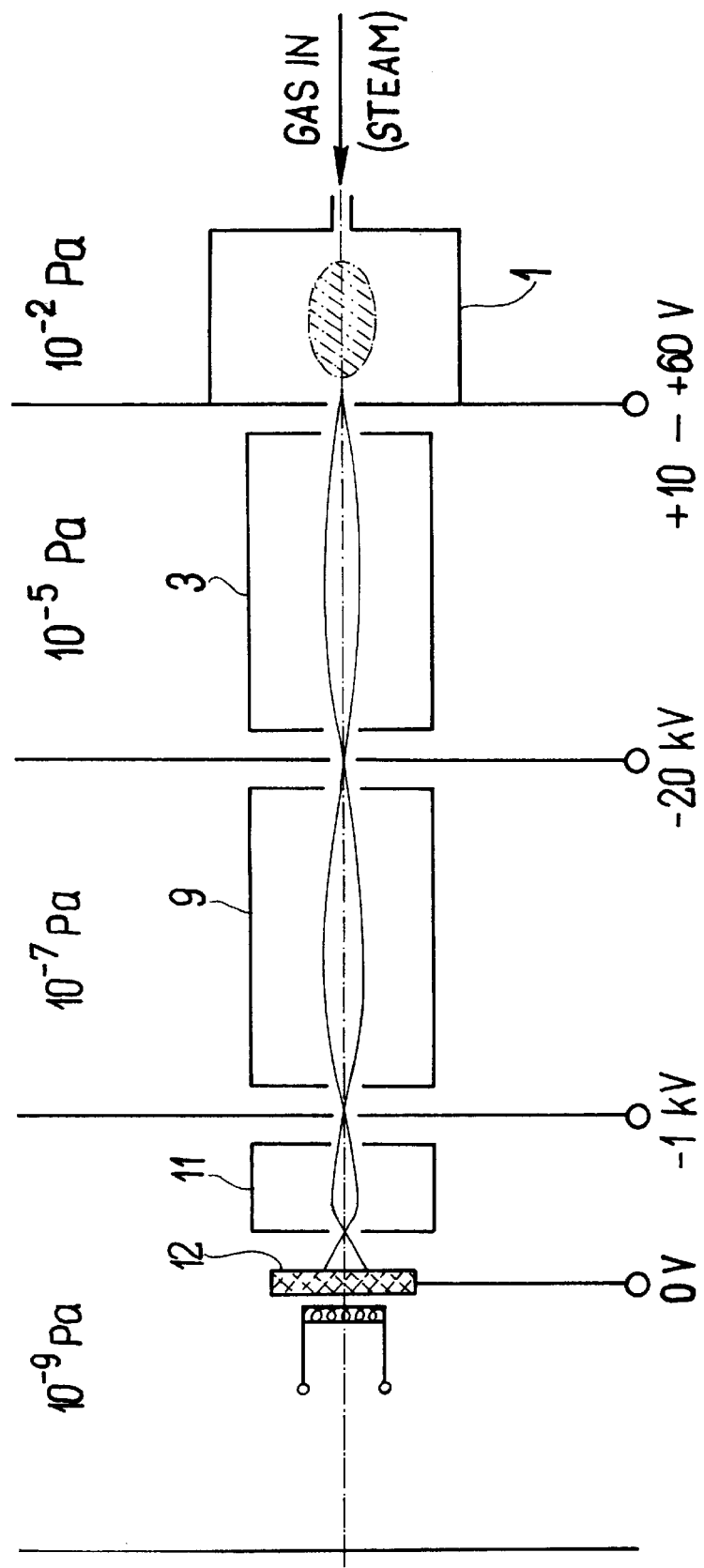
FIG. 2 is a second implementation of the invention.

(see FIG. 2)

Example 2 corresponds to Example 1 with respect to essential details, except for the omission of the q/m separation unit. Accordingly, the whole mixture of charge states as extracted from the ion source 1, here for instance Xe ions, strikes with U·q eV the surface 12, which may be here a platinum monocrystal surface, for instance. This increases the particle flux on the surface and therefore the cleaning power, but the desorption probability per impurity or surface atom hit is somewhat reduced since, depending on the ion source, high fractions of only singly and doubly charged ions are included in the particle flux.

These ions contribute less to the cleaning power than highly charged ions since surface atoms hit by them desorb with less probability than surface atoms hit by highly charged ions. It is therefore important to use ion sources with a particle flux consisting of an average charge state as optimized as is possible. Here, the optimum is defined economically and technologically because the technical effort for the construction of the ion source may be adapted to the lowest charge state of an ionized element, with which, corresponding to the invention, an efficient cleaning and smoothing power is achieved.

The highly charged, low energy ions may be produced from any arbitrary element and particularly from that element of which the surface material is composed.

EXAMPLE 3

Example 3 corresponds to Example 1 with respect to essential details, except for the fact, that the whole set up from the ion source to the surface to be cleaned is constructed using ultra high vacuum technology so that the differential pumping diaphragms 7 and 10 can be omitted. Therefore, the greatest cleanness of the installation becomes possible with the values of the vacuum of choice.

EXAMPLE 4

Example 4 corresponds to Example 2 with respect to essential details, except for the fact that the whole set up from the ion source to the surface to be cleaned is constructed using ultra high vacuum technology, so that the necessity of differential pumping diaphragms may be dropped. Therefore, the greatest cleanness of the installation becomes possible with the values of the vacuum of choice.

EXAMPLE 5

Figure 3:
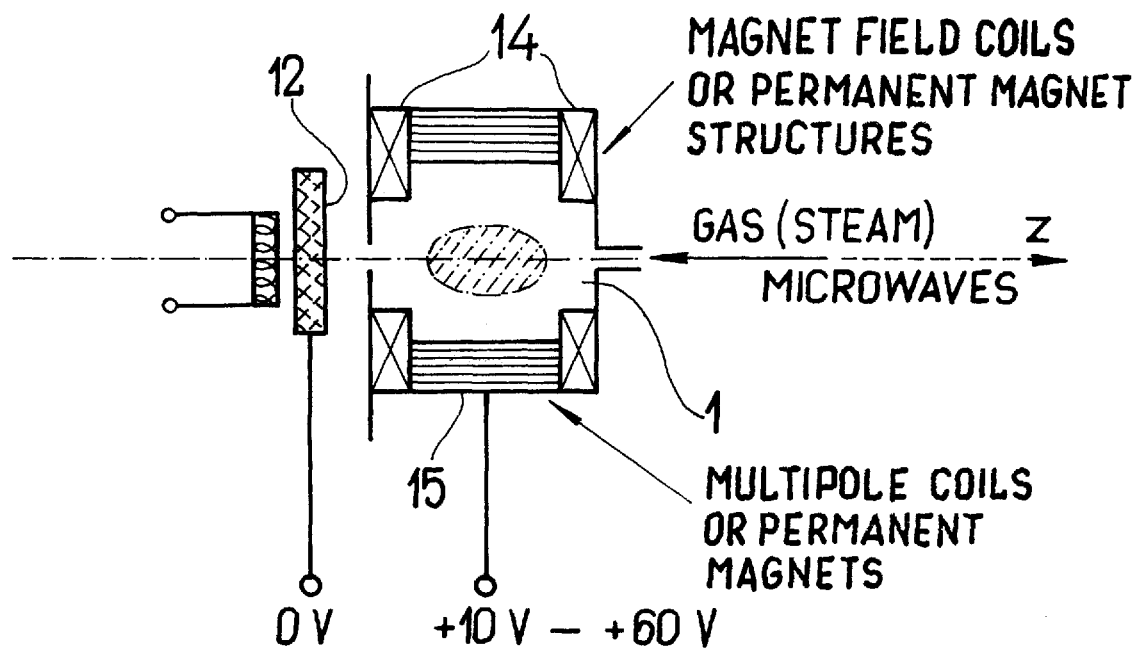
FIGS. 3 and 4 are further implementations of the invention.
Figure 3:
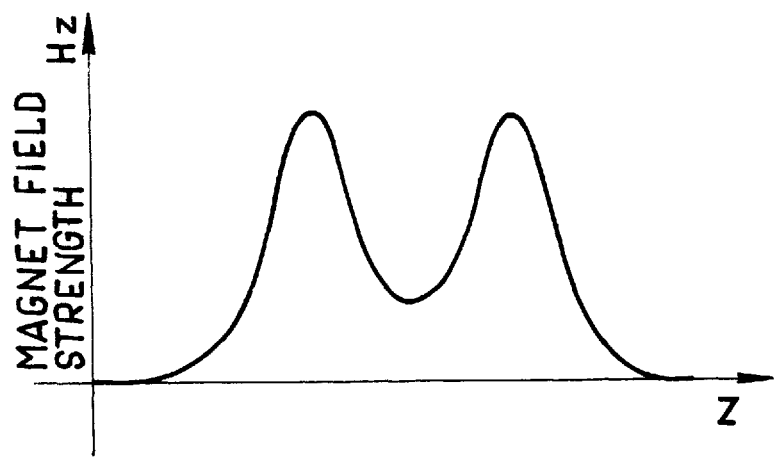

(see FIG. 3)

Ions having a mixture of charge states, here, for instance As-ions, are extracted directly with U·q eV from the plasma 1' of the ion source 1 in the direction toward the surface of the material 12, where $0<U<\approx 60$ V. To this end, corresponding magnetic field coils or structures made of permanent magnets have to be provided. In comparison to Example 1, there is no q/m separation and no ion-optical imaging, and the differential pumping stages are omitted as well. The vacuum technology and the vacuum conditions can be adapted to the respective requirements. This Example is therefore extremely economical. The total particle flux onto the surface and therefore also the cleaning power are increased, on the average. However, the probability of desorption per impurity or surface atom hit is reduced because, depending on the ion source, great fractions of singly and doubly charged ions are also present in the particle flux. The surface atoms hit by these ions desorb with less probability than surface atoms hit by highly charged ions. It is therefore of importance to use ion sources which produce particle fluxes with an average charge state as optimized as possible. Here, the optimum is defined economically and technologically, since the technical effort for the construction of the ion source may be adapted to the lowest charge state of an ionized element, with which, in accordance with the invention, an efficient cleaning and smoothing power is achieved. Since sources for highly charged ions operate mostly with a high magnetic confinement for the ions and electrons, the present Example can only be applied in situations where magnetic stray fields do not perturb the further treatment of the surface. If conditions without magnetic stray fields are required for the further treatment of the surface, the surface has to be cleaned and smoothed with the present Example 5 spatially separated from the further treatment.

EXAMPLE 6

Figure 4:
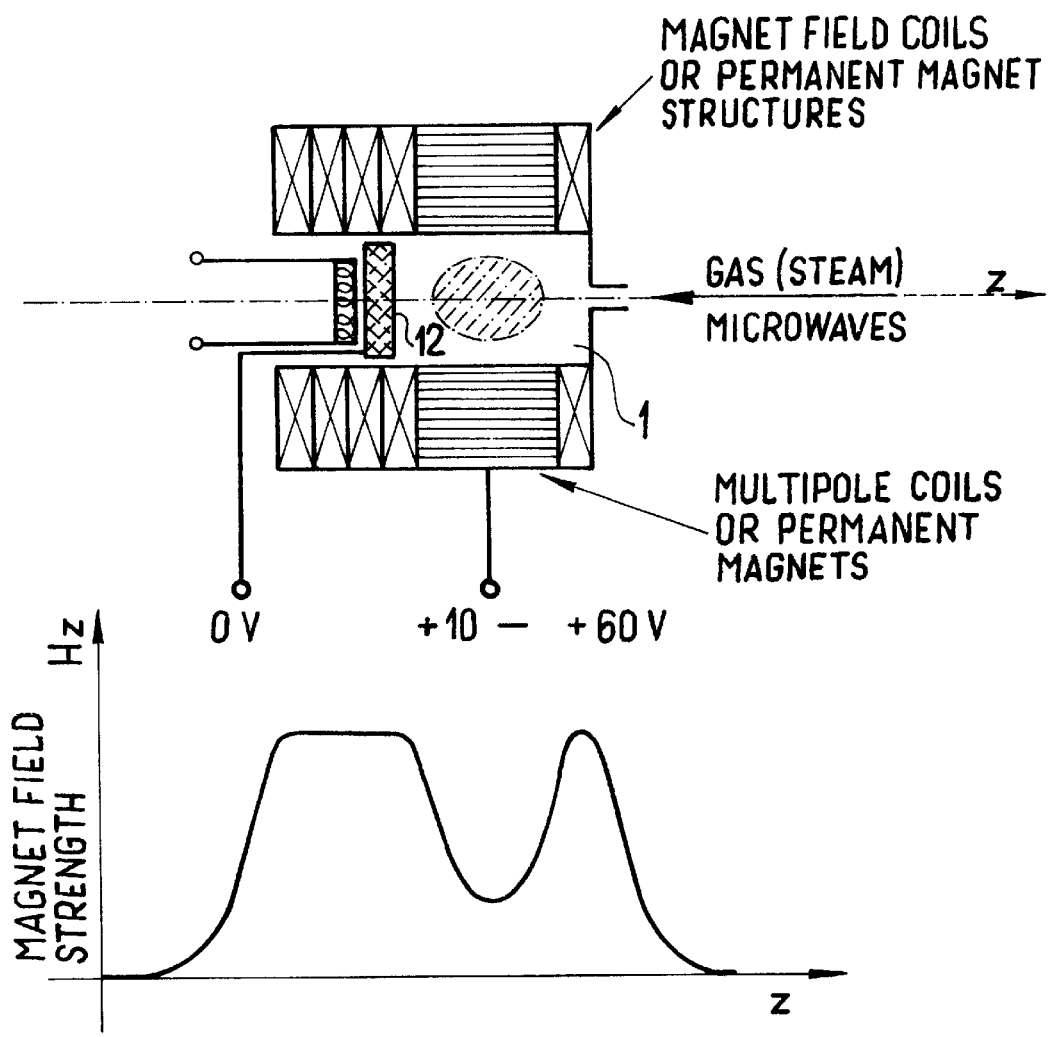

(see FIG. 4)

The whole mixture of charge states in the plasma of the ion source 1 is accelerated directly with U·q eV, where $0<U<\approx 60$ V, onto the surface 12, which is part of the boundary of the plasma volume. The vacuum conditions can be adapted to each specific application. In comparison to Example 5 one further simplification has thus been introduced, so that Example 6 is still more economical than Example 5. All other explanations of Example 5 are exactly adopted for Example 6. It is thus of importance to use a configuration for the generation of the plasma which guarantees a content of optimized average charge state. The optimum is defined economically and technologically.

In the process of the invention, the ions may be generated in an ion source selected from the group consisting of an electron-cyclotron-resonance (ECR) ion source with magnetic plasma confinement, an electron beam ion source, an electron beam ion trap source, and a hybrid ion source combined of at least two of these three types.

The present Example is very related to the technical set up of plasma etching using the ECR-principle, where a plasma of low average charge state is fed with chemical substances in order to etch the surfaces via chemical reactions supported by the plasma (R. A. Haefer, "Oberflächen- and D ünnschicht-Technologie", Springer Verlag 1991, Kapitel 5). Attempts to employ such plasma etching devices, based on the ECR-principle with low average charge state and without chemical admixtures, for the cleaning of surfaces, have had only little success (see P. Raynaud, C. Pomot, Le Vide les Couches Minces, Supplément 256, 1991, pages 140–142; B. Charlet, L. Peccoud, loc. cit., 1991, pages 143–145). The decisive difference of Example 6 is therefore the use of a plasma with high average charge state ($q_m>2$), which can also be generated following the ECR-principle, but requires a high magnetic plasma confinement as it was not explicitly employed in plasma etching devices as yet. FIG. 4 therefore explicitly shows one possible arrangement for high magnetic confinement of the plasma in an axial magnetic field, the relevant magnetic field strength of which is indicated, and with a radial plasma confinement by a magnetic multipole field which is as high as possible.

EXAMPLE 7

Figure 5:
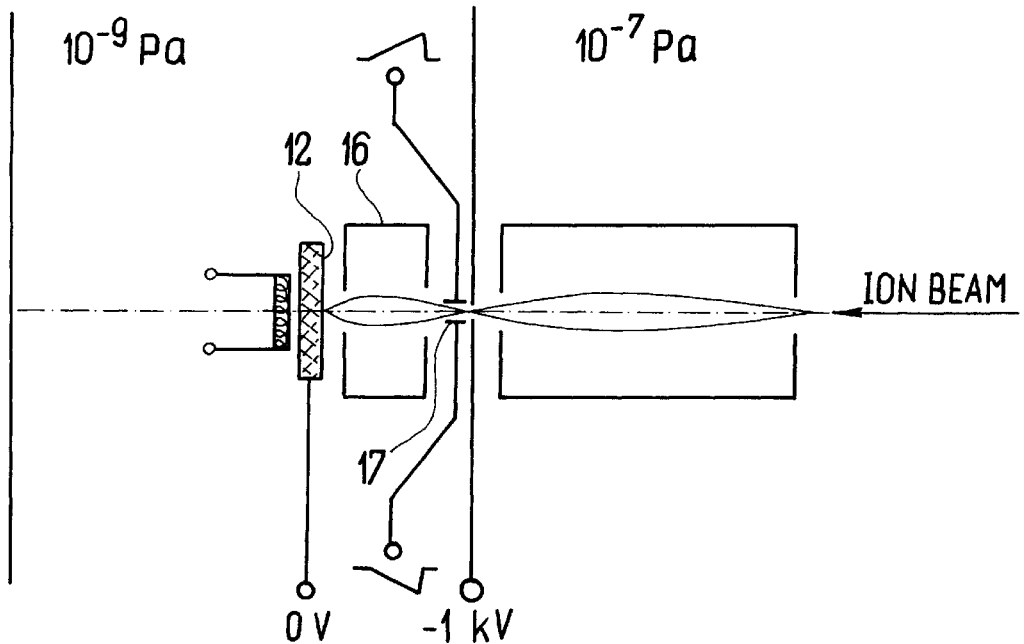
FIG. 5 is a specialization of the first two implementations.
Figure 5:
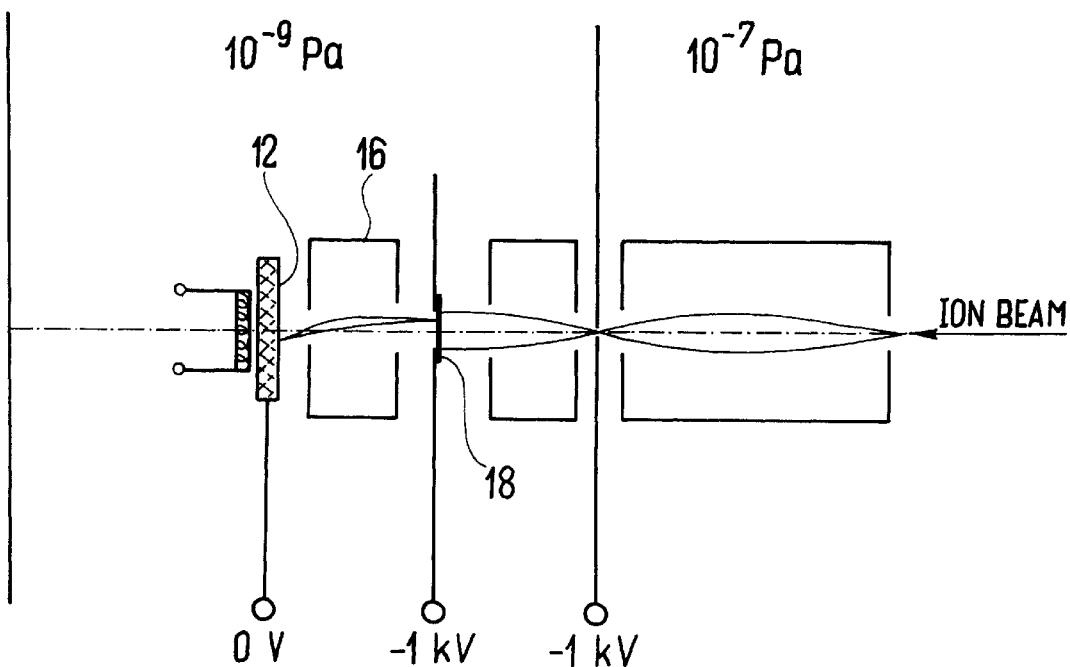

(see FIG. 5)

Example 7 is based on Examples 1–4 and uses in front of the surface 12 ion-optical elements 16, which allow a sharp focussing of the ion beam, here, for instance Zr ions, and an electromagnetic guidance 17 of this focussed ion beam on the surface 12, or a sharp imaging of a semitransparent mask 18 on the surface 12, here, for instance, amorphous Rh$_{25}$Zr$_{75}$. A given cleaning pattern can thereby be projected onto the surface 12. Since one can envisage many forms of projection, only one possibility for an electromagnetic control or guidance 17 of a focussed ion beam on the surface 12 and one possibility for the imaging of a semitransparent mask 18 onto the surface 12 are shown in FIG. 5.

There has thus been shown and described a process for surface treatment with ions which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

I claim:

1. Process for cleaning and smoothing of a surface of a material having monocrystalline, polycrystalline, or amorphous structure, comprising the process steps:
   (a) Polishing of the surface to the smallest possible roughness which can be obtained mechanically,
   (b) bombardment of the surface with ions of definite charge and kinetic energy in order to erode impurities existing at the surface, characterized in that the surface is bombarded with at least doubly charged ions of low kinetic energy, where the potential energy of the ions, corresponding to their high charge, gives rise to an interaction with the impurities existing at the surface, which interaction removes said impurities, and where the low kinetic energy imparted to the ions is determined solely so that the ions can approach the atoms of the impurities as closely as possible without penetrating the surface.

2. Process according to claim 1, characterized in that step (b) is continued or takes place at a temperature of the surface of the material, which is significantly below temperature at which the surface may be annealed.

3. Process according to claim 1, characterized in that step (b) is carried out without following high temperature treatment.

4. Process according to claim 1 characterized in that in step (b) said at least doubly charged ions are generated in an ion source selected from the group consisting of an electron-cyclotron-resonance (ECR) ion source with magnetic plasma confinement, an electron beam ion source, an electron beam ion trap source, and a hybrid ion source combined of at least two of these three types.

5. Process according to claim 1, characterized in that in step (b) a beam of said at least doubly charged ions strikes the surface in the form of a sharp, ion-optical focus, which is guided with electromagnetic means over the surface, thereby producing a cleaned inscription of the surface.

6. Process according to claim 1, characterized in that in step (b) a beam of said at least doubly charged ions illuminates a mask, having transparent and non-transparent parts, which mask is ion-optically imaged onto the surface, thereby generating a cleaned image of the transparent part of the mask on the surface.

7. Process according to claim 1 characterized in that step (b) is continued or takes place at a temperature of the surface of the material in the range between 15° and 35° C.

8. Process according to claim 1 characterized in that step (b) is carried out with argon irons with charge states 5 to 9 (AR$^{5+}$ to AR$^{9+}$).

9. Process according to claim 1, characterized in that said at least doubly charged ions of low kinetic energy are rare gas ions.

10. Process according to claim 1, characterized in that said at least doubly charged ions have more than a double charge.

11. Process according to claim 1, characterized in that said surface is composed of an element and said at least doubly charged ions are produced from the same element of which the surface is composed.

12. Process according to claim 1, comprising generating said at least doubly charged ions in an ion source under vacuum conditions; extracting said at least doubly charged ions from said ion source; ion-optically transporting said at least doubly charged ions to a cleaning chamber; and decelerating said at least doubly charged ions to said low kinetic energy in front of said surface.

13. Process according to claim 12, characterized in that said at least doubly charged ions are separated with respect to their charge to mass ration q/m after extraction from the ion source.

14. Process according to claim 12, characterized in that the ions strike the surface of the material at an inclined angle of incidence, preferably between 8° and 15°, where 0° defines the surface plane of the material.

15. Process according to claim 1, comprising generating said at least doubly charged ions in an electronically hot ion source plasma, said plasma having an average charge >1; extracting a fraction of said at least doubly charged ions with accelerating voltage <60 V; and directing said at least doubly charged ions to said surface.

16. Process according to claim 1, comprising generating said at least doubly charged ions in an electronically hot ion source plasma, said plasma having an average charge >1 and bringing a fraction of said at least doubly charged ions into contact with said surface, where said surface represents a boundary for the plasma volume or the plasma is ignited and maintained in a cleaning chamber in front of said surface.

* * * * *